United States Patent
Kim

(10) Patent No.: US 8,159,077 B2
(45) Date of Patent: Apr. 17, 2012

(54) PAD IN SEMICONDCUTOR DEVICE AND FABRICATING METHOD THEREOF

(75) Inventor: Sung Su Kim, Jeonju-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 638 days.

(21) Appl. No.: 12/276,195

(22) Filed: Nov. 21, 2008

(65) Prior Publication Data

US 2009/0168293 A1  Jul. 2, 2009

(30) Foreign Application Priority Data

Dec. 26, 2007  (KR) .................. 10-2007-0137173

(51) Int. Cl.
*H01L 29/40* (2006.01)
(52) U.S. Cl. ........ 257/786; 257/748; 257/750; 257/773; 257/E23.02; 438/666
(58) Field of Classification Search ........... 257/748, 257/750, 758, 773, 786, E23.019, E23.02, 257/E23.142, E23.144; 438/666
See application file for complete search history.

(56) References Cited

U.S. PATENT DOCUMENTS

| | | | |
|---|---|---|---|
| 7,087,977 B2 * | 8/2006 | Nakayama et al. | 257/532 |
| 7,479,698 B2 * | 1/2009 | Ker et al. | 257/734 |
| 2001/0010408 A1 | 8/2001 | Ker et al. | |

FOREIGN PATENT DOCUMENTS

| | | |
|---|---|---|
| JP | 2005-150383 A | 6/2005 |
| JP | 2006-49486 A1 | 2/2006 |
| KR | 10-2007-0065036 A | 6/2007 |

OTHER PUBLICATIONS

Toshiichi Endo; "Substrate Incorporating Electric Double Layer Capacitor and its Producing Method, and Module Incorporating Electric Double Layer Capacitor"; Patent Abstracts of Japan; Publication No. 2005-150383; Publication Date: Jun. 9, 2005; Japan Patent Office, Japan.
Woo Suk Sul; "Pad Structure of Semiconductor Device Including Signal Transmitting Pad Positioned on Upper Surface of Interlayer Dielectric"; Korean Patent Abstracts; Publication No. 1020070065036 A; Publication Date: Jun. 22, 2007; Korean Intellectual Property Office, Republic of Korea.
Notice of Allowance dated Nov. 10, 2009; Korean Patent Application No. 10-2007-0137173; Korean Intellectual Property Office, Republic of Korea.

\* cited by examiner

*Primary Examiner* — Matthew E Warren
*Assistant Examiner* — John Lin
(74) *Attorney, Agent, or Firm* — The Law Offices of Andrew D. Fortney; Andrew D. Fortney

(57) ABSTRACT

A pad in a semiconductor device and fabricating method thereof are disclosed. The pad includes an uppermost metal layer first to $N^{th}$ intermediate metal layers, wherein capacitors configured or formed by the uppermost metal layer and the first to $N^{th}$ intermediate metal layers are serially connected. Accordingly, the pad reduces total parasitic capacitance components by connecting MIM type capacitors in series, and not necessarily overlapping with each other, thereby minimizing design errors attributed to the pad by reducing parasitic factors generated from the integrated circuit design. The pad may also minimize capacitance attributed to resonance at a specific frequency. Moreover, the pad avoids affecting an adjacent pad or circuit without additional processing, despite maintaining the above-mentioned effects, thereby reducing cost.

20 Claims, 4 Drawing Sheets

PAD IN SEMICONDCUTOR DEVICE AND FABRICATING METHOD THEREOF

This application claims the benefit of the Korean Patent Application No. 10-2007-0137173, filed on Dec. 26, 2007, which is hereby incorporated by reference as if fully set forth herein.

BACKGROUND OF THE INVENTION

1. Field of the Invention

The present invention relates to a semiconductor device, and more particularly, to a pad in a semiconductor device and a fabricating method thereof.

2. Discussion of the Related Art

Generally, a pad is an element mandatory for MMIC (Micro-wave Monolithic Integrated Circuit) or RFIC (Radio Frequency Integrated Circuit) using semiconductor devices. A pad in a semiconductor device is necessary for signal input/output, for measuring characteristics of the device directly, and/or for wire bonding in the case of packaging a fabricated integrated circuit (IC). Namely, the semiconductor device pad plays a role in transferring a signal or supplying a power (or transferring a power) to or from the IC.

A general pad in a semiconductor device is explained with reference to the accompanying drawings as follows.

FIGS. 1A to 1C are diagrams of general pads in semiconductor devices.

First of all, structures of the above pads, which are disclosed in detail in pp. 203~306 of "Ultra Low-capacitance Bond Pad for RF application in CMOS Technology," by Yun-Wen Hsiao et al., are schematically explained as follows.

Referring to FIG. 1A, a general pad consists of a ground metal or a semiconductor substrate electrode 10, metal electrodes M6 to M8 for real measurement probing or wire bonding, and an insulating layer of $Si_3N_4$ or $SiO_2$ between the two electrodes. Since the above structure configures a series of MIM (metal-insulator-metal) capacitors, unnecessary parasitic capacitance is generated in designing an AC integrated circuit. If the parasitic capacitance is not considered in designing an integrated circuit, the integrated circuit may malfunction. Accordingly, many efforts have been made to research and develop methods of reducing parasitic capacitance of a bond pad or a probe pad.

The pad structures shown in FIG. 1B and FIG. 1C are developed to reduce the parasitic capacitance.

Referring to FIG. 1B and FIG. 1C, the structures attempt to reduce parasitic capacitance in a manner of providing a series of spiral inductors M1 to M5 with a single layer or multiple layers under the pad. However, the spiral inductor inserted to reduce the parasitic capacitance may affect a circuit adjacent to the inductor or a neighboring pad. Therefore, in the case of using the general pad, an integrated circuit may have characteristics different from those of the original design.

SUMMARY OF THE INVENTION

Accordingly, the present invention is directed to a pad in a semiconductor device and a fabricating method thereof that substantially obviate one or more problems due to limitations and disadvantages of the related art.

An object of the present invention is to provide a pad in a semiconductor device and a fabricating method thereof, by which a parasitic capacitance component resulting from the pad structure can be reduced and by which abnormalities caused by an inductor inserted to reduce the parasitic capacitance can be basically or substantially prevented.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose(s) of the invention, as embodied and broadly described herein, a pad in a semiconductor device according to the present invention includes an uppermost metal layer, and first to $N^{th}$ (where N is a positive integer equal to or greater than 1) intermediate metal layers below the uppermost metal layer, wherein vertical capacitors between adjacent metal layers are serially connected.

In another aspect of the present invention, a method of fabricating a pad in a semiconductor device includes the steps of sequentially forming first to $N^{th}$ (where N is a positive integer equal to or greater than 1) intermediate metal layers, and forming an uppermost metal layer thereover, wherein vertical capacitors between adjacent metal layers are serially connected.

Accordingly, the present invention reduces total parasitic capacitance components by connecting MIM type capacitors in series together, preferably not overlapping with each other, thereby minimizing design error(s) attributed to the pad by reducing influence on parasitic factors generated from integrated circuit design.

The MIM capacitors formed by the present method have a series and/or spiral configuration, thereby generating less inductance and/or reducing capacitance attributed to the MIM capacitor serial connection, if necessary. Therefore, it is able to minimize capacitance attributed to resonance at a specific frequency.

Moreover, the present invention avoids affecting a neighboring pad or circuit without additional processing or additional structures, despite maintaining the above-mentioned effects, thereby reducing a cost.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to preferred embodiments of the present invention, examples of which are illustrated in the accompanying drawings. Wherever possible, the same reference numbers will be used throughout the drawings to refer to the same or like parts.

Figure 1A:
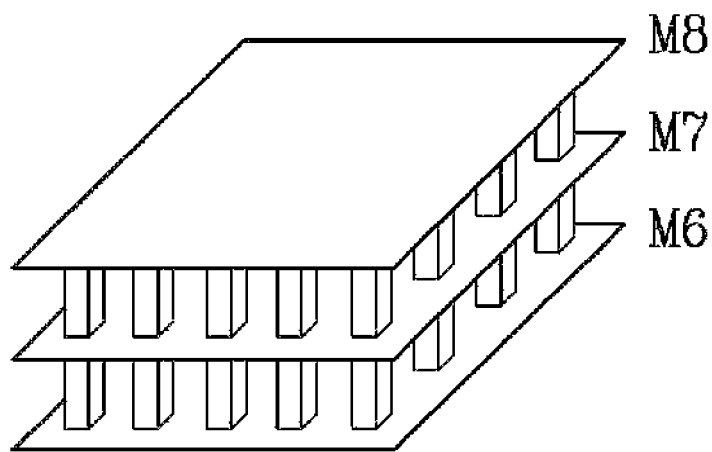
FIGS. 1A to 1C are diagrams of general pads in semiconductor devices.
Figure 1A:
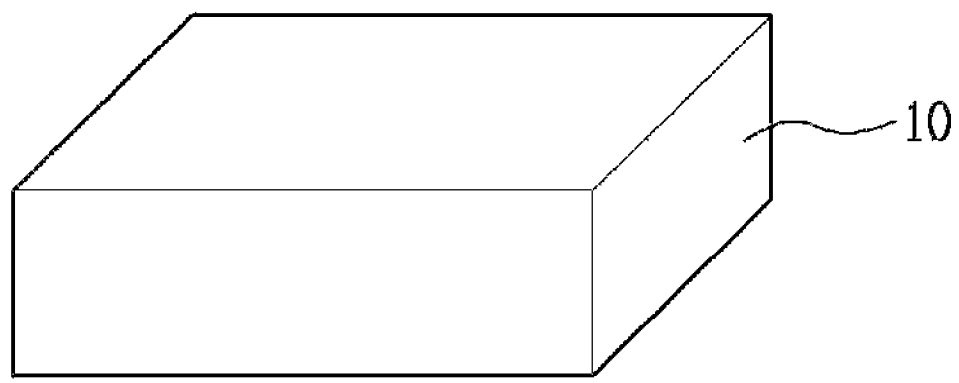
Figure 1B:
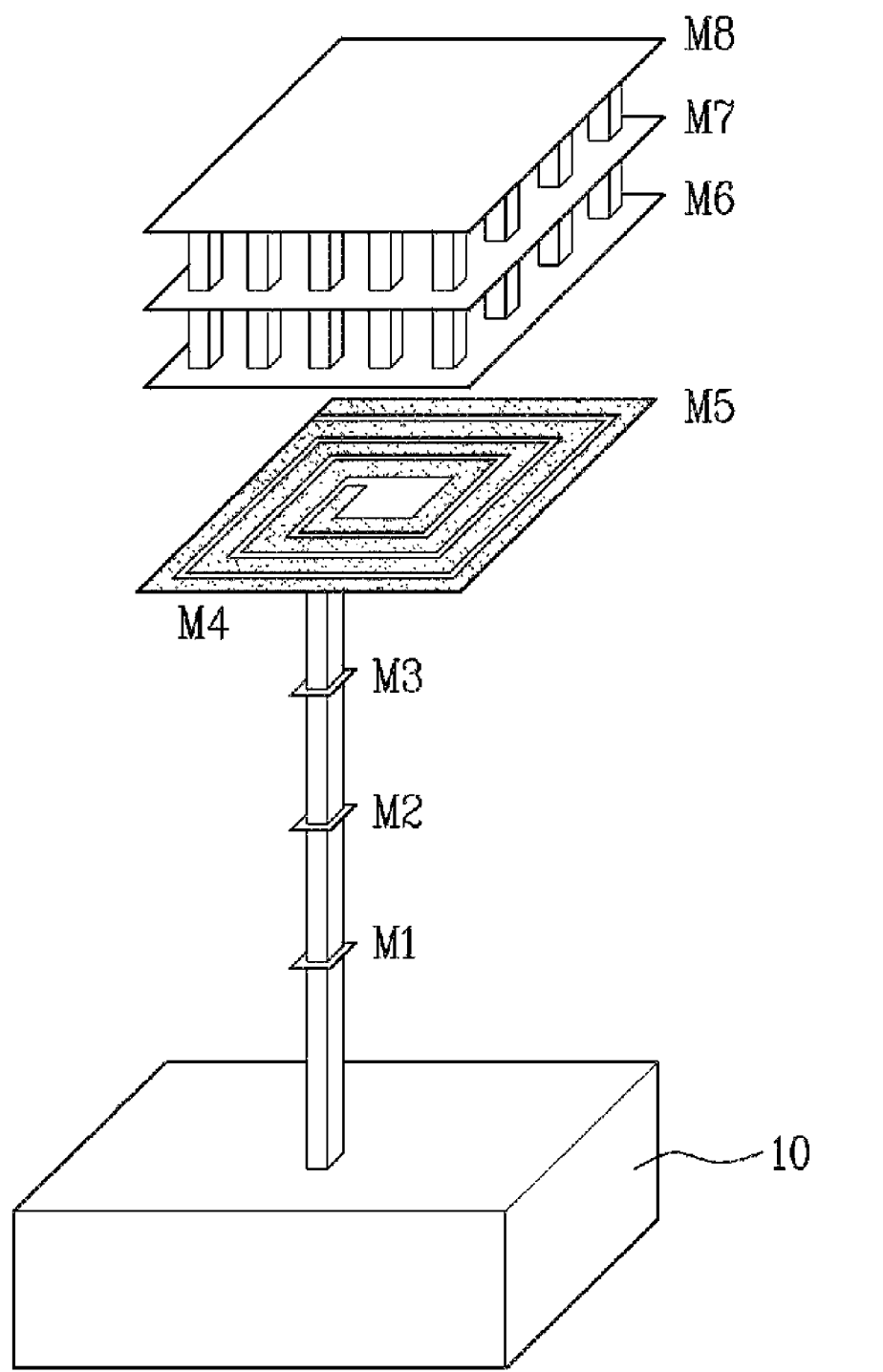
Figure 1C:
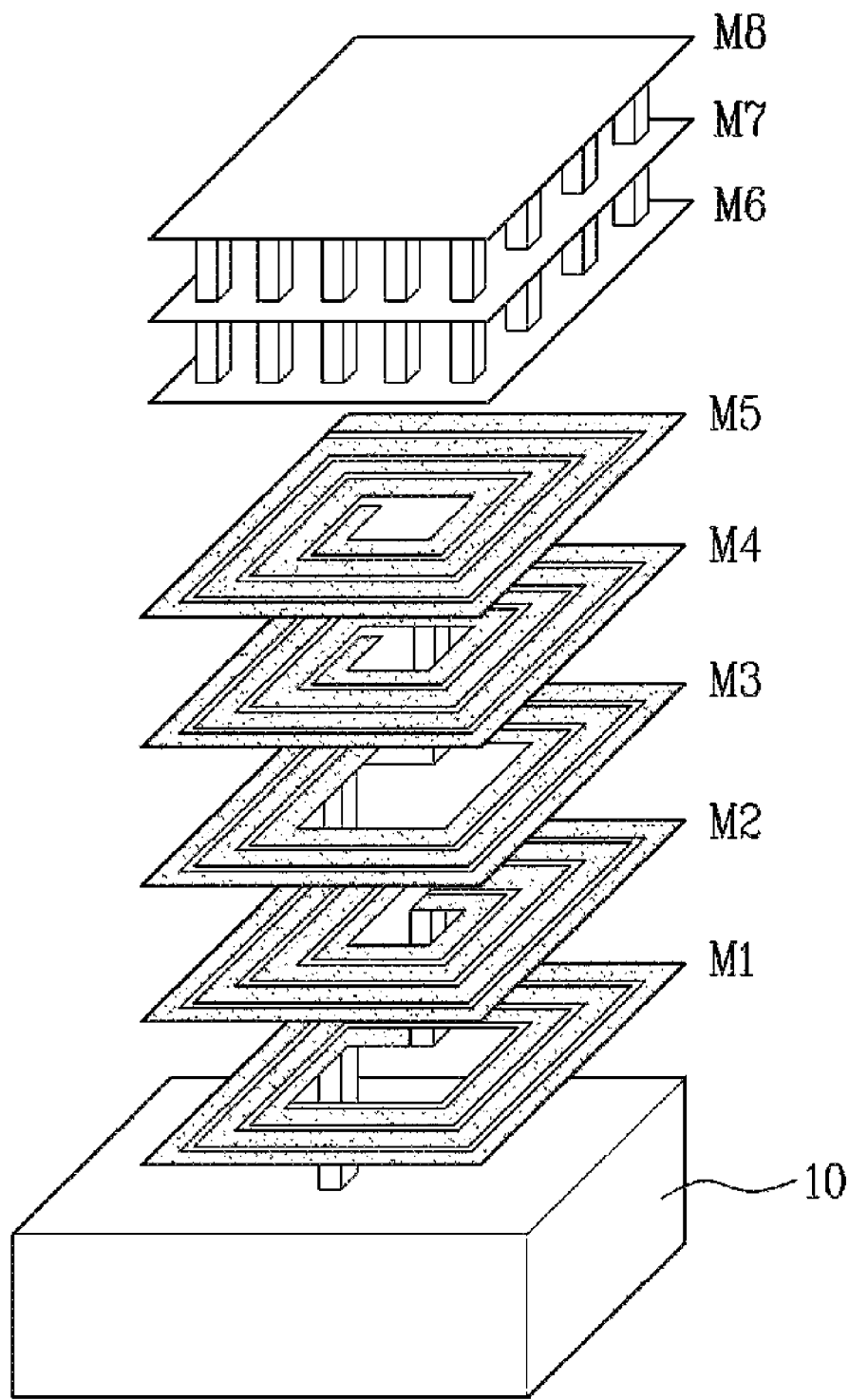
Figure 2:
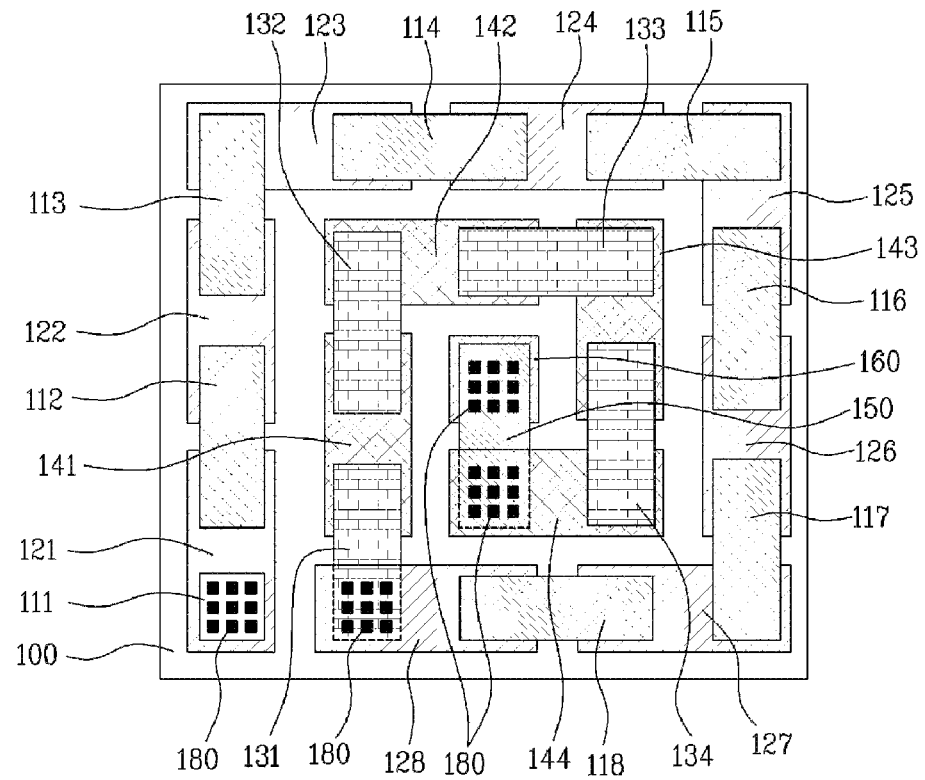
FIG. 2 is a layout of an exemplary pad in a semiconductor device according to embodiments of the present invention.
Figure 3:
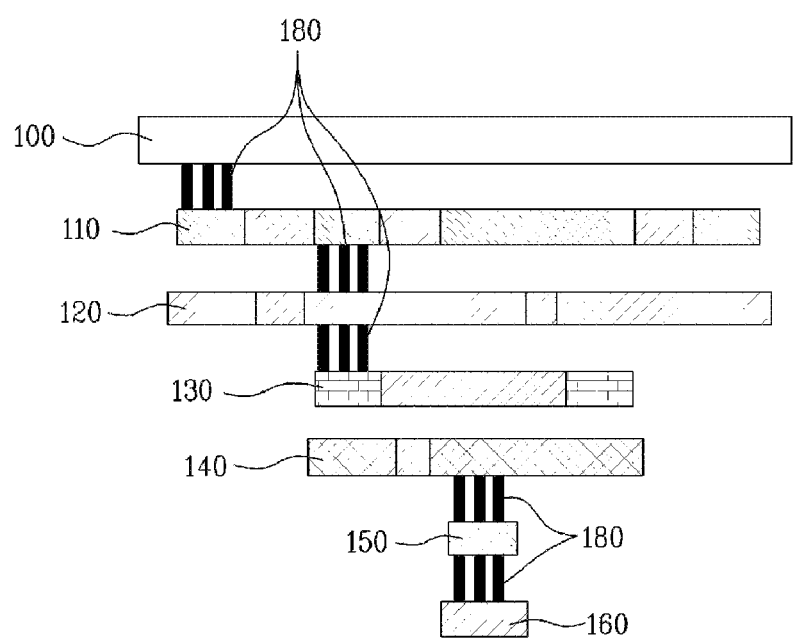
FIG. 3 is a front diagram of the exemplary pad shown in FIG. 2.

FIG. 2 is a layout of an exemplary pad in a semiconductor device according to embodiments of the present invention and FIG. 3 is a front diagram of the exemplary pad shown in FIG. 2.

An uppermost metal layer 100 can be provided, generally as a relatively large sheet, square or rectangle that may have dimensions on the order of 10-200 μm per side, preferably on the order of 40-120 μm per side. $1^{st}$ to $N^{th}$ intermediate metal layers are in sequence below the metal layer 100. In this case, N is a positive integer equal to or greater than 1, preferably $\geq 2$. When $N \geq 2$, a plurality of MIM capacitors may be formed in series and/or in parallel.

Referring to FIG. 2 and FIG. 3, if N=5, a fifth intermediate metal layer 110 is under the upper metal layer 100. In reverse sequence, fourth to first intermediate metal layers 120, 130, 140 and 150 are under the fifth intermediate metal layer 110.

A lowermost conductive layer 160 is provided to a lowest layer of the pad. If N=5, the lowermost conductive layer 160 is formed under the first intermediate metal layer 150. In this case, the lowermost conductive layer 160 can include a semiconductor substrate.

According to the present invention, the uppermost metal layer 100 and the fifth to $N^{th}$ intermediate metal layers 100 to 150 have a configuration that forms vertical MIM (metal-insulator-metal) capacitors connected together in series.

The structure of the pad including the serially-connected capacitors according to the present invention is explained in detail as follows.

First of all, the fifth intermediate metal layer 110 includes fifth intermediate sub-layers or portions 111 to 118. The fifth intermediate sub-layers 111 to 118 are under an outermost edge of the uppermost metal layer 100 to be spaced apart from each other. One of the fifth intermediate sub-layers 111 to 118 is connected to the uppermost metal layer 100 by a first via 180.

The fourth intermediate metal layer 120 includes fourth intermediate sub-layers or portions 121 to 128. The fourth intermediate sub-layers 121 to 128 are under the fifth intermediate sub-layers 111 to 118, alternately overlapping with the fifth intermediate sub-layers 111 to 118 in a vertical direction.

For instance, if N=5, the fourth intermediate sub-layer 122 is under the fifth intermediate sub-layers 112 and 113 (or portions thereof), alternately overlapping with the fifth intermediate sub-layers 112 and 113 in the vertical direction. The fourth intermediate sub-layer 123 is under the fifth intermediate sub-layers 113 and 114 (or portions thereof), alternately overlapping with the fifth intermediate sub-layers 113 and 114 in the vertical direction. The fourth intermediate sub-layer 124 is under the fifth intermediate sub-layers 114 and 115 (or portions thereof), alternately overlapping with the fifth intermediate sub-layers 114 and 115 in the vertical direction. And, each of the fourth intermediate sub-layers 125 to 128 is arranged in the same manner.

The $(N-2)^{th}$ intermediate metal layer includes $(N-2)^{th}$ intermediate sub-layers or portions, where $N \geq 3$ or 4.

The $(N-2)^{th}$ intermediate sub-layers are under the outermost edge or portion of the pad within the area enclosed by the $N^{th}$ intermediate metal layer(s), spaced apart from each other. The $(N-3)^{th}$ intermediate metal layer includes $(N-3)^{th}$ intermediate sub-layers or portions. And, the $(N-3)^{th}$ intermediate sub-layers under the $(N-2)^{th}$ intermediate sub-layers alternately overlap with the $(N-2)^{th}$ intermediate sub-layers in the vertical direction.

As mentioned in the foregoing description, a size of the intermediate sub-layers or portions thereof alternately overlapping with each other in the vertical direction can be sufficient to form MIM capacitors. Thus, the $N^{th}$ intermediate sub-layers 111 to 118 may be provided or arranged under the 'most outer edge' of the uppermost metal layer 100 and the $(N-2)^{th}$ intermediate sub-layers are provided under the 'most outer edge' of the area enclosed by the $N^{th}$ intermediate metal layer. This is to maximize the number of capacitors connected in series in the pad of the present invention.

For instance, when N=5, the third intermediate sub-layers 131 to 134 are under the outermost edge of the inner area enclosed by the fifth ($N^{th}$) intermediate metal layers 111 to 118.

The second intermediate sub-layers or portions 141 to 144 are under the third intermediate sub-layers 131 to 134, alternately overlapping with the third intermediate sub-layers 131 to 134 in the vertical direction.

In particular, the second intermediate sub-layer 141 is under the third intermediate sub-layers 131 and 132 alternately overlapping with the third intermediate sub-layers 131 and 132 in the vertical direction. And, the second intermediate sub-layer 142 is arranged under the third intermediate sub-layers 132 and 133 alternately overlapping with the third intermediate sub-layers 132 and 133 in the vertical direction. Each of the second intermediate sub-layers 143 and 144 is provided in the same manner.

In a further embodiment of the present invention, the $(2x-1)^{th}$ intermediate sub-layer configures a capacitor by vertically overlapping with the $2x^{th}$ intermediate sub-layer, where $1 \leq x \leq N-2$. Yet, the $(2x-1)^{th}$ intermediate sub-layer does not vertically overlap with the layer provided under the $2x^{th}$ intermediate sub-layer. For instance, the fifth intermediate sub-layers 111 to 118 configure a capacitor by vertically overlapping with the fourth intermediate sub-layers 121 to 128, respectively. Yet, the fifth intermediate sub-layers 111 to 118 do not overlap with the third intermediate sub-layers and the lowermost conductive layers 130 to 160 under the fourth intermediate sub-layers 121 to 128, respectively. If they overlap, parallel capacitors may be configured by placing or forming the intermediate sub-layers vertically adjacent to each other.

One of the $(y+1)^{th}$ intermediate sub-layers or portions of the $(y+1)^{th}$ intermediate metal layer is connected to the $y^{th}$ intermediate metal layer by a second via 180, where $1 \leq y \leq N-1$.

If y=4, one of the fourth intermediate sub-layers 121 to 128 of the fourth intermediate metal layer 120 is connected to the fifth intermediate metal layer 110 by the second via 180. Yet, if y=3, none of the second intermediate sub-layers 141 to 144 of the second intermediate metal layer 140 is connected to the third intermediate metal layer 130 by the via 180.

Thus, there exists the $(y+1)^{th}$ intermediate metal layer in which one of the $(y+1)^{th}$ intermediate sub-layers is connected to the $y^{th}$ intermediate metal layer by the via 180. Yet, it can be observed that there is the $(y+1)^{th}$ intermediate metal layer configured in a manner that one of the $(y+1)^{th}$ intermediate sub-layers is not connected to the $y^{th}$ intermediate metal layer by the via.

Meanwhile, the layers connected together by the via 180 among the intermediate sub-layers neighboring to each other vertically are unable to form upper and lower electrodes of the MIM capacitor.

If N=5, assume that the uppermost metal layer 100 and the fifth intermediate metal layer 110 form a first capacitor, the fifth and fourth intermediate metal layers 110 and 120 form a second capacitor, the fourth and third intermediate metal layers 120 and 130 form a third capacitor, and the third and second intermediate metal layers 130 and 140 form a fourth capacitor.

In this case, the first to fourth capacitors are connected in series. Therefore, it can be observed that the parasitic capacitance component of the pad, which corresponds to total capacitance of the first to fourth capacitors, is reduced. This is because total sum of the serially-connected N capacitance components is reduced by 1/N.

Referring to the layout shown in FIG. 2, serially-configured capacitors and the first to $N^{th}$ intermediate metal layers also form a spiral inductor.

According to the present invention, a shape of the spiral inductor can include one of a tetragon, an octagon, or a circle. In FIG. 2, an inductor has a tetragonal shape in forming a pad of a semiconductor device.

Meanwhile, in FIG. 3, the vertically-overlapping intermediate sub-layers configure or form upper and lower electrodes of a capacitor, respectively. A space between the vertically-overlapping intermediate sub-layers, and more particularly, a gap between the upper and lower electrodes corresponds to a dielectric layer.

In FIG. 3, dielectric layers exist between each of the layers 100 to 160, respectively. In this case, the dielectric layer can comprise $Si_3N_4$ and/or $SiO_2$.

A method of fabricating a pad in a semiconductor device according to the present invention is explained as follows.

First of all, first to $N^{th}$ intermediate metal layers are formed on or over a semiconductor substrate or a lowermost conductive layer. In this case, an uppermost metal layer 100 is formed over the $N^{th}$ intermediate metal layer.

Each metal layer may comprise sputter-deposited aluminum or aluminum alloy (e.g., Al with up to 4 wt. % Cu, up to 2 wt. % Ti, and/or up to 1 wt. % Si), on conventional adhesion and/or barrier layers (e.g., Ti and/or TiN, such as a TiN-on-Ti bilayer), and/or covered by conventional adhesion, barrier, hillock suppression, and/or antireflective layers (e.g., Ti, TiN, WN, TiW alloy, or a combination thereof, such as a TiN-on-Ti bilayer or a TiW-on-Ti bilayer). The contacts/vias (e.g., 180) between the metal layers may each comprise tungsten (deposited by chemical vapor deposition [CVD]) or aluminum or aluminum alloy (e.g., as described above, deposited by sputtering), on conventional adhesion and/or barrier layers (e.g., Ti and/or TiN, such as a TiN-on-Ti bilayer). The Ti, TiN and TiW layers may be deposited by CVD or sputtering.

In particular, the first to $N^{th}$ intermediate metal layers are formed to enable capacitors, which are configured by the uppermost metal layer 100 to the first intermediate metal layer, to have a serially-connected structure.

For instance, if N=5, the first to fifth intermediate metal layers 150 to 110, as shown in FIGS. 2 and 3, may be formed. In this case, the first to fifth intermediate metal layers are formed in a manner such that the capacitors vertically configured by the uppermost metal layer 100 to the first intermediate metal layers 120 to 150 are serially connected.

In case of the aforesaid semiconductor device according to the present invention, the drawings in case of are referred to. Moreover, the present invention is applicable to the case of 'N<5' or 'N≧6'.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A pad in a semiconductor device, comprising:
    a) an uppermost metal layer in an area of the pad; and
    b) first to $N^{th}$ (where N is a positive integer equal to or greater than 2) sequential intermediate metal layers below the uppermost metal layer, comprising the $N^{th}$ intermediate metal layer and an $(N-1)^{th}$ intermediate metal layer, the $N^{th}$ intermediate metal layer having an $N^{th}$ plurality of discontinuous, horizontally spaced apart sub-layers and the $(N-1)^{th}$ intermediate metal layer comprising an $(N-1)^{th}$ plurality of discontinuous, horizontally spaced apart sub-layers, wherein portions of the $N^{th}$ plurality of sub-layers overlap portions of the $(N-1)^{th}$ plurality of sub-layers to form a plurality of serially connected vertical capacitors.

2. The pad of claim 1, wherein the $N^{th}$ plurality of sub-layers are under an outermost edge of the uppermost metal layer.

3. The pad of claim 2, wherein N≧3, and an $(N-2)^{th}$ intermediate metal layer is within an area enclosed by the $N^{th}$ intermediate metal layer, the $(N-2)^{th}$ intermediate metal layer having an $(N-2)^{th}$ plurality of discontinuous, horizontally spaced apart sub-layers.

4. The pad of claim 3, wherein N≧4, and the $(N-3)^{th}$ intermediate metal layer comprises an $(N-3)^{th}$ plurality of discontinuous, horizontally spaced apart sub-layers under the $(N-2)^{th}$ plurality of sub-layers, the $(N-3)^{th}$ sub-layers alternately overlapping with the $(N-2)^{th}$ plurality of sub-layers in a vertical direction, and wherein the sub-layers that vertically overlap with each other configure or form upper and lower capacitor electrodes.

5. The pad of claim 2, wherein N≧5, wherein an $(N-4)^{th}$ intermediate metal layer having an $(N-4)^{th}$ plurality of discontinuous, horizontally spaced apart sub-layers forms a capacitor by vertically overlapping with the $(N-3)^{th}$ plurality of sub-layers, and wherein the $(N-4)^{th}$ plurality of sub-layers does not vertically overlap with any intermediate metal layer over the $(N-3)^{th}$ plurality of sub-layers.

6. The pad of claim 2, wherein one of the $N^{th}$ plurality of sub-layers is connected to the uppermost metal layer by a first via.

7. The pad of claim 6, wherein one of the $(N-1)^{th}$ plurality of sub-layers is connected to the $N^{th}$ intermediate metal layer by a second via.

8. The pad of claim 1, further comprising a lowermost conductive layer.

9. The pad of claim 8, wherein the lowermost conductive layer comprises a semiconductor substrate.

10. The pad of claim 1, wherein each of the vertical capacitors comprises a dielectric layer.

11. The pad of claim 10, wherein the dielectric layer comprises $Si_3N_4$ and/or $SiO_2$.

12. The pad of claim 1, wherein the serially connected vertical capacitors and the first to $N^{th}$ intermediate metal layers configure or form a spiral inductor.

13. The pad of claim 12, wherein the spiral inductor has a shape selected from the group consisting of a tetragon, an octagon, and a circle.

14. A pad in a semiconductor device, comprising:
    a) an uppermost metal layer in an area of the pad; and
    b) a plurality of stacked metal layers below the uppermost metal layer, comprising an $N^{th}$ intermediate metal layer having an $N^{th}$ plurality of discontinuous, horizontally spaced apart sub-layers and an $(N-1)^{th}$ intermediate metal layer comprising an $(N-1)^{th}$ plurality of discontinuous, horizontally spaced apart sub-layers, wherein the $N^{th}$ and the $(N-1)^{th}$ intermediate metal layers form a plurality of serially connected vertical capacitors.

15. The pad of claim 14, wherein portions of the N$^{th}$ plurality of sub-layers overlap portions of the (N-1)$^{th}$ plurality of sub-layers to form the plurality of serially connected vertical capacitors.

16. The pad of claim 14, wherein the N$^{th}$ plurality of sub-layers are under an outermost edge of the uppermost metal layer.

17. The pad of claim 16, wherein N≧3, wherein an (N-2)$^{th}$ intermediate metal layer is within an area enclosed by the N$^{th}$ intermediate metal layer, the (N-2)$^{th}$ intermediate metal layer having an (N-2)$^{th}$ plurality of discontinuous, horizontally spaced apart sub-layers.

18. The pad of claim 17, wherein N≧4, wherein an (N-3)$^{th}$ intermediate metal layer comprises an (N-3)$^{th}$ plurality of discontinuous, horizontally spaced apart sub-layers under the (N-2)$^{th}$ plurality of sub-layers, alternately overlapping with the (N-2)$^{th}$ plurality of sub-layers in the vertical direction, and the sub-layers that vertically overlap with each other configure or form upper and lower capacitor electrodes.

19. The pad of claim 18, wherein N≧5, wherein an (N-4)$^{th}$ intermediate metal layer having an (N-4)$^{th}$ plurality of discontinuous, horizontally spaced apart sub-layers forms a capacitor by vertically overlapping with the (N-3)$^{th}$ plurality of sub-layers, and the (N-4)$^{th}$ plurality of sub-layers does not vertically overlap with any intermediate metal layer over the (N-3)$^{th}$ plurality of sub-layers.

20. The pad of claim 14, wherein one of the N$^{th}$ plurality of sub-layers is connected to the uppermost metal layer by a first via, and one of the (N-1)$^{th}$ plurality of sub-layers is connected to the N$^{th}$ intermediate metal layer by a second via.

* * * * *